(12) United States Patent
Pan et al.

(10) Patent No.: US 6,660,628 B1
(45) Date of Patent: Dec. 9, 2003

(54) METHOD OF MOCVD TI-BASED BARRIER METAL THIN FILMS WITH TETRAKIS (METHYLETHYLAMINO) TITANIUM WITH OCTANE

(75) Inventors: Wei Pan, Vancouver, WA (US); Wei-Wei Zhuang, Vancouver, WA (US); David R. Evans, Beaverton, OR (US); Sheng Teng Hsu, Cama, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 10/391,291

(22) Filed: Mar. 17, 2003

(51) Int. Cl.$^7$ .......................................... H01L 21/4763
(52) U.S. Cl. ................. 438/627; 438/643; 438/648; 438/653; 438/656; 438/685; 438/785
(58) Field of Search ................. 438/627, 643, 438/648, 653, 656, 685, 785

(56) References Cited

U.S. PATENT DOCUMENTS

| | | | | |
|---|---|---|---|---|
| 6,017,818 A | * | 1/2000 | Lu | 438/653 |
| 6,037,013 A | * | 3/2000 | Hsu et al. | 438/653 |
| 6,120,842 A | * | 9/2000 | Lu et al. | 438/653 |
| 6,495,449 B1 | * | 12/2002 | Nguyen | 438/627 |
| 2002/0072227 A1 | * | 6/2002 | Russell et al. | 438/653 |

OTHER PUBLICATIONS

T. Harada, et .al., *Surface Modification of MOCVD–TiN Films by Plasma Treatment and $SiH_4$ Exposure for Cu Interconnects*, Conf. Proceedings ULSI XIV 1999.

M. Eizenberg, *Chemical Vapor Deposition of TiN for ULSI Applications*, Mat. Res. Soc. Symp. Proc. vol. 427 1996.

* cited by examiner

Primary Examiner—John F. Niebling
Assistant Examiner—Lynne Gurley
(74) *Attorney, Agent, or Firm*—David C. Ripma; Matthew D. Rabdau; Scott C. Krieger

(57) ABSTRACT

A method of forming a titanium-based barrier metal layer includes preparing a substrate, including forming IC elements on the substrate; forming a titanium-based barrier metal precursor using a solution of about 5% by volume tetrakis (methylethylamino) titanium (TMEAT) and about 95% by volume octane; and depositing a titanium-based barrier layer on the substrate by MOCVD.

12 Claims, 3 Drawing Sheets

METHOD OF MOCVD TI-BASED BARRIER METAL THIN FILMS WITH TETRAKIS (METHYLETHYLAMINO) TITANIUM WITH OCTANE

FIELD OF THE INVENTION

This invention relates to barrier films for copper interconnects, and specifically to a method of enhancing coverage of titanium-based barrier metals.

BACKGROUND OF THE INVENTION

There are three known precursors used in the metal-oxide chemical vapor deposition (MOCVD) of TiN or TiSiN films: tetrakis (dimethylamino) titanium (TDMAT) for TiN/TiSiN thin barrier films, tetrakis (diethylamino) titanium (TDEAT) for TiN/TiSiN films, and tetrakis (methylethylamino) titanium (TMEAT) used for barrier applications. Among those three, TMEAT offers the best process control and also provides better film properties, such as superior step coverage and lower resistivity.

T. Harada, et. al., in their paper *Surface Modification of MOCVD-TiN Films by Plasma Treatment and $SiH_4$ Exposure for Cut Interconnects*, Conf. Proceedings ULSI XIV 1999, describe MOCVD of TiN thin films from TDMAT which are formed in a self-aligned manner, wherein the $SiH_4$ treatment was stated to increase copper wettability and improve copper crystallization, while providing a barrier which did not significantly increase via resistance.

M. Eizenberg, in *Chemical Vapor Deposition of TiN for ULSI Applications*, Mat. Res. Soc. Symp. Proc. Vol. 427 1996, describes the use of TDMAT in CVD of TiN barrier layers.

SUMMARY OF THE INVENTION

A method of forming a titanium-based barrier metal layer includes preparing a substrate, including forming IC elements on the substrate; forming a titanium-based barrier metal precursor using a solution of about 5% by volume tetrakis (methylethylamino) titanium (TMEAT) and about 95% by volume octane; and depositing a titanium-based barrier layer on the substrate by MOCVD.

It is an object of the invention to provide a titanium-based barrier metal thin film layer precursor.

Another object of the invention is to provide a titanium-based barrier metal thin film layer precursor having a relatively high mean-time to failure.

Still another object of the invention is to provide a single-source precursor for a TiN barrier layer.

Yet another object of the invention is to provide a TiN precursor which negates the use of $NH_3$ during the barrier layer deposition and fabrication.

A further object of the invention is to provide a titanium-based barrier metal thin film layer precursor having a relatively low leakage current.

Another object of the invention is to provide a precursor which is a mixture of TMEAT and octane.

A further object of the invention is to provide a TiN precursor which is relatively inexpensive and which provide good wetting characteristics for subsequent layer formation.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENT

Figure 1:
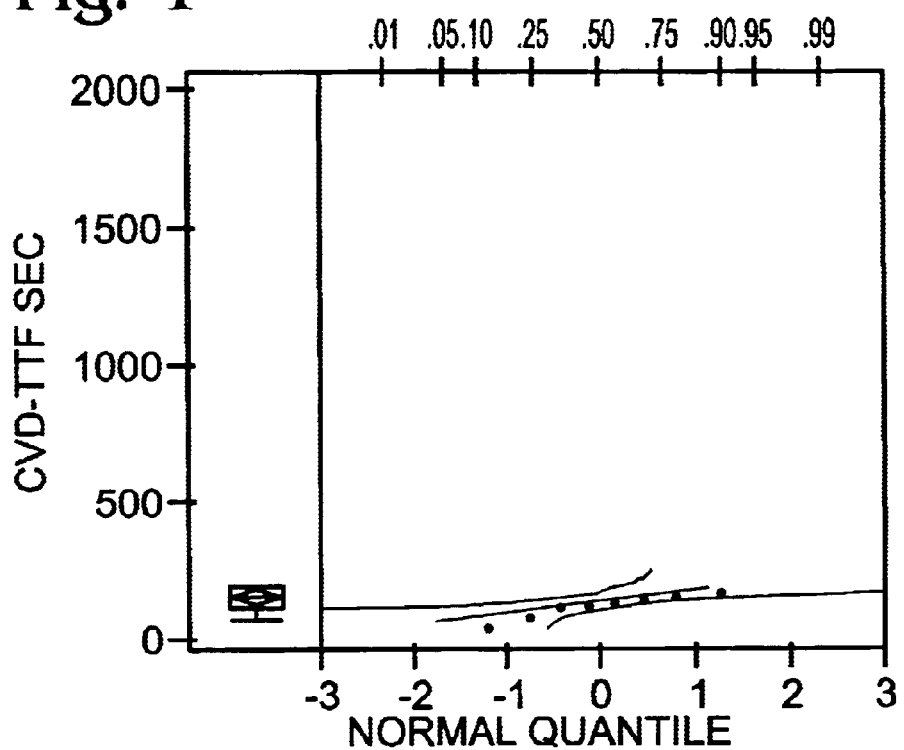
FIG. 1 is a graph of mean-time-to-failure of PVD TiN thin films.

The method of the invention includes a technique for deposition of a titanium-based thin film as a barrier layer prior to copper interconnect formation, wherein tetrakis (methylethylamino) titanium (TMEAT) is mixed with Octane (95% by volume) to boost the resultant precursor's efficiency and to reduce the fabrication cost without sacrificing the barrier properties required for copper interconnects.

The method of the invention differs from the prior art in that: (1) a single source for TiN deposition is the only source: $NH_3$ is not required, as in the known prior art, for TiN deposition. The resulting film properties are superior to TiN films deposited from PVD or non-treated CVD; (2) The TMEAT is mixed with Octane, 95% by volume, which is a new way to use TMEAT in TiN deposition; (3) The precursor mixture is much cheaper and does not clog the showerhead in the deposition chamber, as does prior art precursors; (4) The precursor of the method of the invention has better wetting character with CVD copper, and also has better adhesion characteristics; and (5) The precursor provides better contact resistance after $SiH_4$ treatment.

As mentioned above, thin TiN/TiSiN barrier films formed using a TMEAT precursor have shown better step coverage and lower resistivity. In a comparable basis, i.e., no post plasma treatment, which is a method used to improve TiSiN barrier property, the TiSiN films made from a TMEAT precursor has been demonstrated to have a 25% lower resistivity compared to a thin film formed from tetrakis (dimethylamino) titanium (TDMAT). The plasma treatment, as is well understood by one of ordinary skill in the art, produces a non-homogeneous layer. Therefore, the post plasma treatment is of benefit only adjacent the bottom of vias and trenches. TiSiN films formed on via and trench sidewalls have different barrier properties then those formed on the bottom, where the plasma treatment is relatively effective. Ironically, the goal of CVD of TiSiN is generally to improve the side wall barrier layer.

The precursor used in the method of the invention is formulated as follows: In a nitrogen-filled glove box, 475 cc of octane ($C_8H_{18}$) is placed into an ampoule, followed by 25 cc of TMEAT. The precursor is ready for use.

The precursor is introduced into the vaporizer through a liquid flow controller by an argon push gas. The precursor, octane and TMEAT, is vaporized and carried into the deposition chamber by an argon carrier gas. The precursor of the invention is decomposed on the wafer surface, resulting in the deposition of TiN thin films. The deposition temperature of the subject wafers is in a range of between about 300° C. to 450° C.

The single-source precursor of the method of the invention is sufficient to deposit a high quality barrier film for subsequent copper applications. There is no need for a second $NH_3$ gas, as is required in known prior art methods, where $NH_3$ is needed for TiN CVD with other precursors, such as TDMAT and TDEAT. Further, the requisite plasma treatment of the prior art is not needed for thin films deposited by the method of the invention, which plasma treatments are required in the prior art in order to improve barrier layer properties.

After TiN deposition, $SiH_4$ gas is introduced into the chamber for a short period of time, e.g., in a range from between about 30 seconds to 120 seconds, which forms a surface-silicon layer rich in TiN. This surface silicon layer enhances copper wetting characteristics for subsequent copper deposition, which may be done by a PVD copper seed-layer process, or by a CVD of copper. Where a copper layer is formed by CVD of copper, the wafer may be moved directly into a copper CVD chamber after TiN barrier deposition. The resulting contact resistance is lower than that of prior art techniques. The resulting copper thin films have shown better adhesion characteristics than copper thin films deposited on a PVD TiN barrier layer. The barrier properties of thin films formed using the method- of the invention are compared with prior art PVD films and the results are shown in FIGS. 1 to 4.

Figure 2:
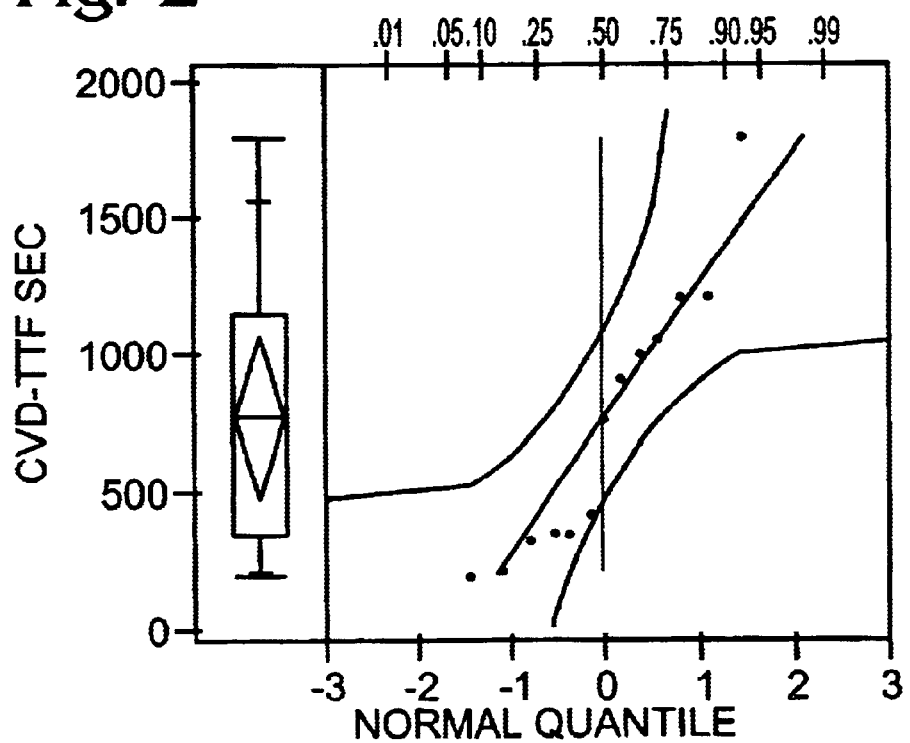
FIG. 2 is a graph of mean-time-to-failure of CVD TISiN thin films.
Figure 3:
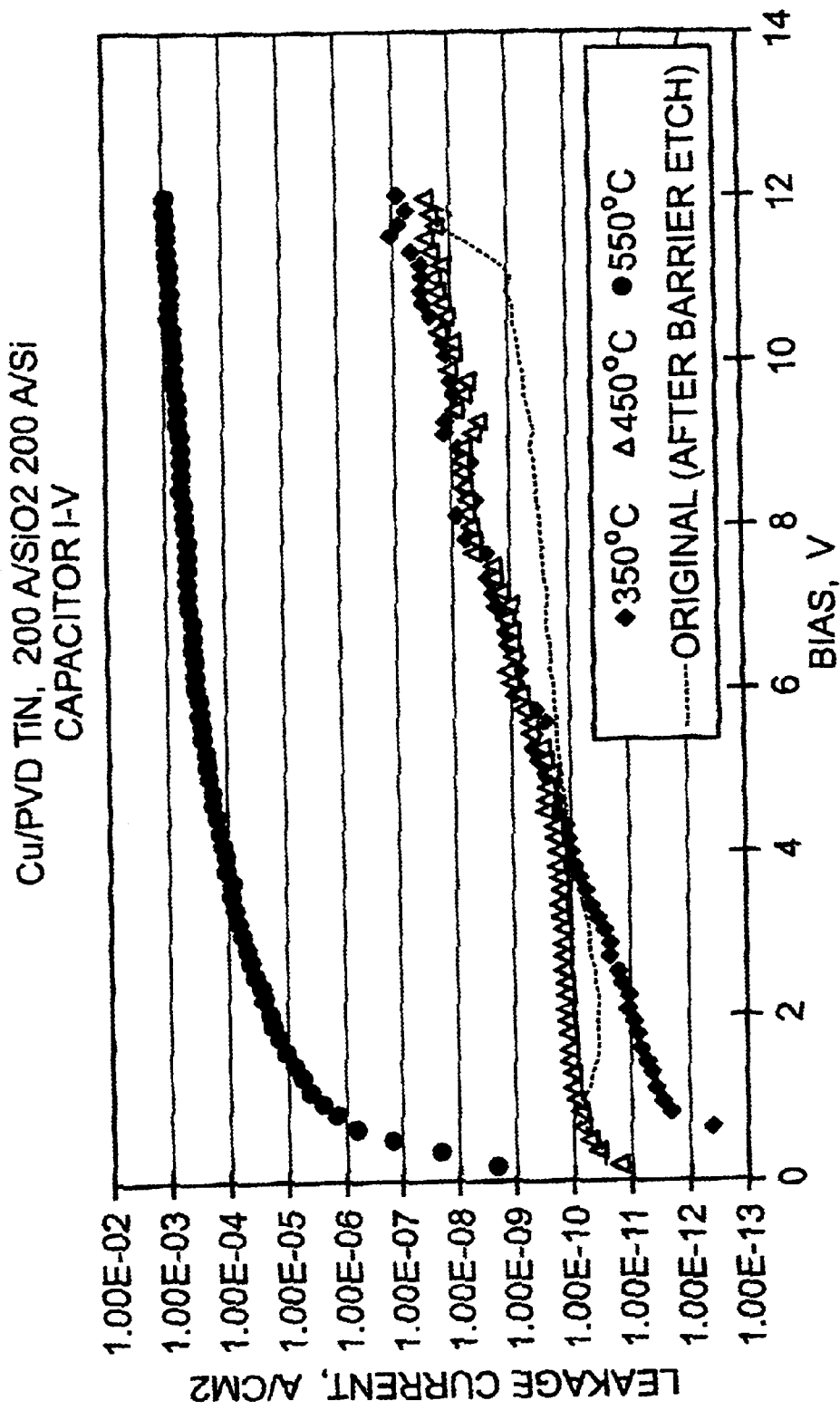
FIG. 3 is a graph of a thermal stress test of PVD TiN thin films.
Figure 4:
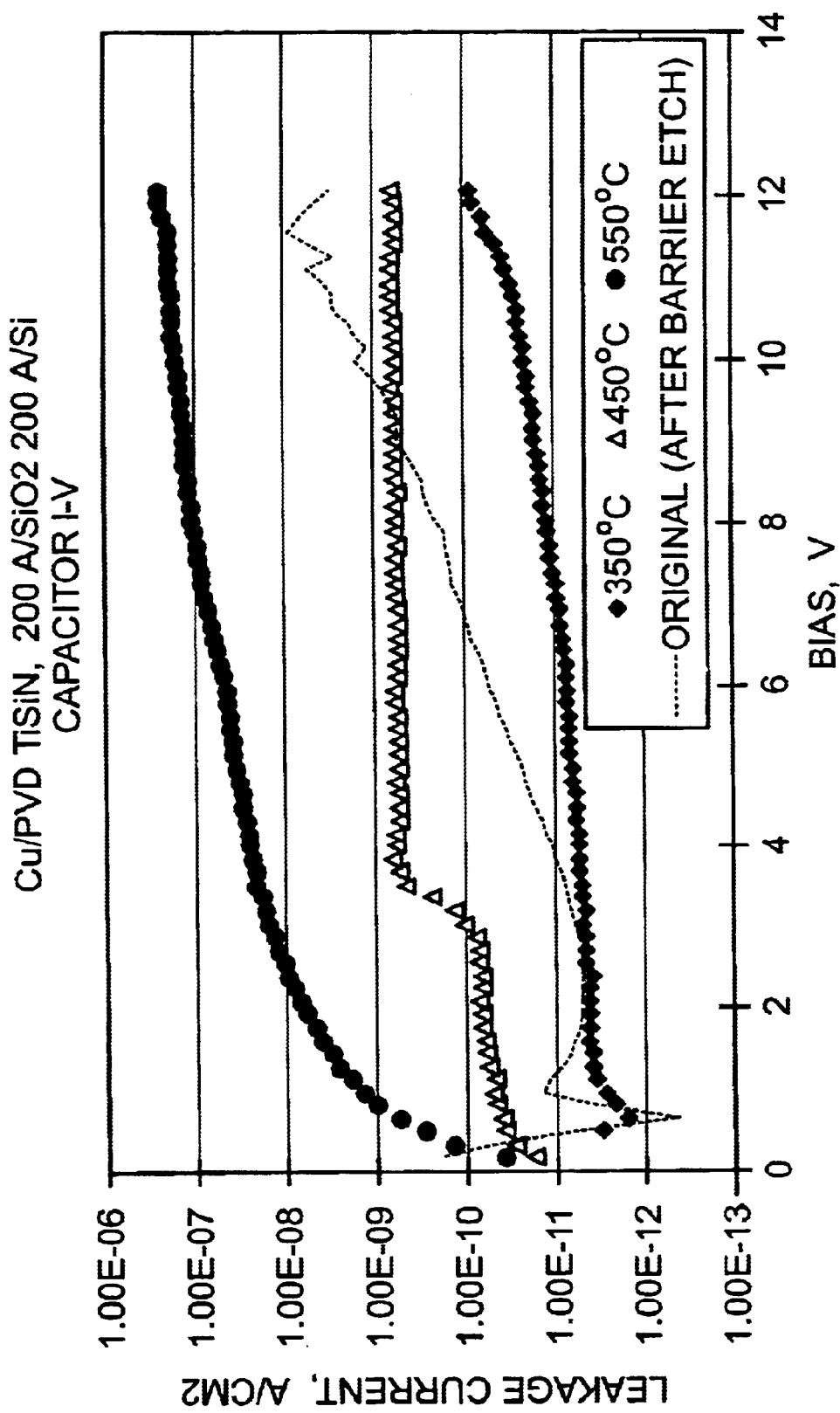
FIG. 4 is a graph of thermal stress test of CVD TiSiN thin films.

An evaluation of the TiSiN thin films through bias-stress tests and thermal stress tests produced the results shown in FIGS. 1–4, establishing that MOCVD TiSiN thin film has better barrier properties than does a PVD TiN thin film. The bias-stress test results, time-to-failure-under-external-field, are shown in FIGS. 1 and 2 for PVD of TiN and MOCVD of TiSiN, respectively. The thermal stress test results depicting leakage current after thermal stress, are shown in FIGS. 3 and 4 for PVD of TiN and MOCVD of TiSiN, respectively.

As shown in FIG. 1, PVD TiN films have much lower mean time-to-failure compared to a CVD TiSiN thin film. The external field used was 2 MV/cm and an ambient temperature 180° C. Thermal stress test results are shown in FIG. 3 for a PVD TiN thin film and in FIG. 4 for a CVD TiSiN thin film. CVD TiSiN films have much lower leakage after the same thermal treatment.

Thus, a method for MOCVD of a titanium-based barrier metal thin film with a tetrakis(methylethylamino)titanium and octane precursor has been disclosed. It will be appreciated that further variations and modifications thereof may be made within the scope of the invention as defined in the appended claims.

We claim:

1. A method of forming a titanium-based barrier metal layer comprising:
    preparing a substrate, including forming IC elements on the substrate;
    forming a titanium-based barrier metal precursor using a solution of about 5% by volume tetrakis (methylethylamino) titanium (TMEAT) and about 95% by volume octane; and
    depositing a titanium-based barrier layer on the substrate by MOCVD.

2. The method of claim 1 wherein said forming includes, in a nitrogen-filled glove box, placing about 475 cc of octane $(C_8H_{18})$ into an ampoule; and placing about 25 cc of TMEAT into the ampoule.

3. The method of claim 1 wherein said depositing includes vaporizing the precursor; carrying the precursor into the deposition chamber in an argon carrier gas; decomposing the precursor at the wafer surface; and depositing the decomposed precursor on the wafer surface as a TiN thin films.

4. The method of claim 3 wherein, during said depositing, the wafer is maintained at a temperature in a range of between about 300° C. to 450° C.

5. The method of claim 1, which includes, after said depositing, introducing $SiH_4$ gas into the chamber for a period of time in a range from between about 30 seconds to 120 seconds, to form a surface-silicon layer rich in TiN.

6. A method of forming a titanium-based barrier metal layer comprising:
    preparing a substrate, including forming IC elements on the substrate;
    forming a titanium-based barrier metal precursor using a solution of about 5% by volume tetrakis (methylethylamino) titanium (TMEAT) and about 95% by volume octane, including, in a nitrogen-filled glove box, mixing about 475 cc of octane $(C_8H_{18})$ and about 25 cc of TMEAT; and
    depositing a titanium-based barrier layer on the substrate by MOCVD.

7. The method of claim 6 wherein said depositing includes vaporizing the precursor; carrying the precursor into the deposition chamber in an argon carrier gas; decomposing the precursor at the wafer surface; and depositing the decomposed precursor on the wafer surface as a TiN thin films.

8. The method of claim 7 wherein, during said depositing, the wafer is maintained at a temperature in a range of between about 300° C. to 450° C.

9. The method of claim 6, which includes, after said depositing, introducing $SiH_4$ gas into the chamber for a period of time in a range from between about 30 seconds to 120 seconds, to form a surface-silicon layer rich in TiN.

10. A method of forming a titanium-based barrier metal layer comprising:
    preparing a substrate, including forming IC elements on the substrate;
    forming a titanium-based barrier metal precursor using a solution of about 5% by volume tetrakis (methylethylamino) titanium (TMEAT) and about 95% by volume octane, including, in a nitrogen-filled glove box, mixing about 475 cc of octane $(C_8H_{18})$ and about 25 cc of TMEAT;
    depositing a titanium-based barrier layer on the substrate by MOCVD; and
    introducing $SiH_4$ gas into the chamber for a period of time in a range from between about 30 seconds to 120 seconds, to form a surface-silicon layer rich in TiN.

11. The method of claim 10 wherein said depositing includes vaporizing the precursor; carrying the precursor into the deposition chamber in an argon carrier gas; decomposing the precursor at the wafer surface; and depositing the decomposed precursor on the wafer surface as a TiN thin films.

12. The method of claim 11 wherein, during said depositing, the wafer is maintained at a temperature in a range of between about 300° C. to 450° C.

* * * * *